(12) United States Patent
Magoon et al.

(10) Patent No.: US 7,486,137 B2
(45) Date of Patent: Feb. 3, 2009

(54) SYSTEM AND METHOD FOR POWER AMPLIFIER OUTPUT POWER CONTROL

(75) Inventors: Rahul Magoon, Irvine, CA (US); Ichiro Aoki, San Clemente, CA (US); John Lyu, San Clemente, CA (US); Scott Kee, Dana Point, CA (US); Roberto Aparico Joo, Newport Beach, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 59 days.

(21) Appl. No.: 11/655,000

(22) Filed: Jan. 18, 2007

(65) Prior Publication Data

US 2008/0061875 A1    Mar. 13, 2008

Related U.S. Application Data

(60) Provisional application No. 60/843,191, filed on Sep. 8, 2006.

(51) Int. Cl.
*H03G 3/20* (2006.01)
(52) U.S. Cl. .................... 330/140; 330/9; 330/102; 330/195
(58) Field of Classification Search ............ 330/140, 330/296, 195, 9, 102
See application file for complete search history.

(56) References Cited

U.S. PATENT DOCUMENTS

| | | | | |
|---|---|---|---|---|
| 4,165,493 A | | 8/1979 | Harrington | |
| 6,137,354 A | * | 10/2000 | Dacus et al. | 330/51 |
| 6,252,455 B1 | * | 6/2001 | Kurby et al. | 330/136 |
| 6,756,849 B2 | * | 6/2004 | Dupuis et al. | 330/279 |
| 7,062,237 B2 | * | 6/2006 | Brandt | 455/127.1 |
| 7,276,966 B1 | * | 10/2007 | Tham et al. | 330/136 |
| 7,330,072 B2 | * | 2/2008 | Brandt | 330/133 |
| 2006/0066396 A1 | | 3/2006 | Brandt | |

FOREIGN PATENT DOCUMENTS

EP    0 458 071 A    11/1997

OTHER PUBLICATIONS

International Search Report and Written Opinion for corresponding PCT/US2007/019472, dated Mar. 23, 2008 (12 pgs).

* cited by examiner

*Primary Examiner*—Patricia Nguyen
(74) *Attorney, Agent, or Firm*—Jackson Walker L.L.P.; Christopher J. Rourk

(57) ABSTRACT

An architecture for detecting amplifier power is provided. The architecture includes a voltage envelope detector that receives a voltage signal and generates a voltage envelope signal. A current envelope detector receives a current signal and generates a current envelope signal. A power amplifier level controller receives the greater of the voltage envelope signal and the current envelope signal, such as by connecting the output of the voltage envelope detector and the current envelope detector at a common point and conducting the high frequency current components to ground via a capacitor. A power amplifier level control signal is then generated based on the voltage drop across the capacitor.

31 Claims, 9 Drawing Sheets

SYSTEM AND METHOD FOR POWER AMPLIFIER OUTPUT POWER CONTROL

RELATED APPLICATIONS

The present application claims priority to U.S. Provisional Patent Application No. 60/843,191, filed Sep. 8, 2006 entitled "Architecture for Detecting Amplifier Power"; and is related to pending U.S. patent application Ser. No. 11/654,744, filed Jan. 18, 2007 and entitled "System and Method for Power Amplifier Output Power Control."

FIELD OF THE INVENTION

The present invention relates generally to power control for use with power amplifiers, and more particularly to an architecture for detecting amplifier power.

BACKGROUND OF THE INVENTION

In many applications utilizing a power amplifier, it is desirable to control the amplifier's output power, so that the output power may be controlled independently of the input signal. For instance, in GSM cellular phones, the power amplifier may be required to have its output power ramped from a low level to the desired transmit power in a controlled manner at the beginning of a transmission burst. Furthermore, in such GSM systems, the amplifier may be required to have its output power ramped down to a low level at the end of the transmission burst. Other systems and other cellular phone standards can have similar power control requirements, such as adjusting the transmit level and/or ramping up and down the power level in a controlled manner according to time-slotting requirements.

FIG. 1 is a diagram of a representative plot of the output power of a prior art power amplifier in a time-division multiple-access communications system, such as in GSM cellular telephony. The output power of the power amplifier, indicated by the representative curve 101, may be controlled from a low level before transmitting data, held at a higher level while transmitting data, and then brought down to a low level after the data is sent. Many systems have requirements that the power must be held between certain levels, indicated by the upper limit 102 and the lower limit 103, so that the power is held between these limits at all times during the transmission. It is also common that the output frequency spectrum has limits placed on it so that the particular shape of the ramp up and ramp down or power must be accurately controlled. If the shape deviates from the desired shape, particularly if sharp transitions occur, the output frequency spectrum may fail. It is also often desirable to have accurate control over the amount of output power during the time of data transmission 104. Each of these requirements may have to be met by the power control system.

There are a number of approaches to regulating the output power of an amplifier. Typically, such as when accuracy is required, some form of closed loop system can be used. In these systems, some operating parameter of the power amplifier which is related to the output power is measured and a feedback loop adjusts the power level until the detected parameter indicates that the output power is as desired. Some typical detected parameters include the amplifier supply voltage, the amplifier supply current, the output power as reported by a directional coupler in series with the output, and the output voltage envelope. Different detection parameters can have different advantages and disadvantages relative to each other. For instance, supply current sense and directional coupler power methods typically require inserting components in series with either the supply current or the output signal resulting in reduced power added efficiency, whereas supply voltage sense and output voltage sense do not typically have this disadvantage. Another example is that supply voltage sense and supply current sense can be relatively inaccurate as they are detecting a parameter that is indirectly related to the output signal level, whereas the directional coupler power and output voltage sense methods sense the output signal directly. Also, the supply voltage sense and output voltage sense methods can have high output power variation under load mismatch, whereas the directional coupler power and supply current sense methods can be less sensitive to load mismatch.

FIG. 2 is a diagram of a prior art power amplifier and power control system using output voltage detection. Power amplifier 212 receives rf input 213 which it amplifies to produce rf output 214. The amplitude of the rf output 214 can be adjusted by the control signal 219. Amplitude detector 215 generates a feedback signal 216 related to the sensed amplitude of the output rf signal 214. Error amplifier 217, which may be an integrating amplifier or other differencing amplifier, compares the feedback signal 216 to a power control input signal 218 so as to adjust control signal 219 in a way which tends to reduce the difference between the feedback and input signals. In this way, power control input signal 219 can control the output power of the power amplifier. As discussed previously, other types of detectors can be used instead of amplitude detector 215 to generate feedback signal 216, such as a detector sensing the dc current, the dc voltage, or a detector sensing the power from a directional coupler.

An issue that can arise in systems using power amplifier power control is that it is often desired to keep the amplifier output power in regulation at all times. For instance, in the GSM cellular standard, the transmission burst must meet a time mask requirement and a spectral frequency mask requirement, each of which can be difficult if the output power does not closely track the desired output power. If the power amplifier is incapable of making the output power requested, the output power can be less than the requested power for the duration of time wherein the power requested is higher than can be made. This clipping of the output power can be disadvantageous in multiple ways.

FIG. 3 is a diagram of a representative prior art power versus time plot in a situation where this clipping occurs. In this case, the output power 305 requested of the power amplifier is higher than the maximum power that the amplifier can produce, as indicated by the line 306. At the times when the amplifier is requested to make more power than this maximum power, the amplifier will typically instead produce its maximum power as indicated by waveform 307. This can cause a failure to pass the upper limit 102 of the time mask, as the power waveform in the region around area 308 can be above the mask. Additionally, sharp corner in the power versus time plot such as area 309 can cause failure to comply with the output frequency spectrum.

In addition to causing the output power to clip, requesting more power than the PA can produce can also cause a behavior known as wind-up. This can occur when the feedback loop contains an integrator or other high gain device with limited bandwidth so that the error signal in the feedback loop causes the control loop to keep increasing even after the power amplifier ceases to make more output power with increasing control signal. This can result in the control signal being much higher than the responsive range of the power amplifier when the desired output power is then reduced. This can cause a delay between the requested reduction and the actual reduction in output power since the control loop must first reduce the control voltage to the useful range before the power can begin to reduce.

FIG. 4 is a representative prior art power versus time plot in a situation where this wind-up occurs. In this case, the output power 305 requested of the power amplifier is higher than the maximum power that the amplifier can produce, as indicated by the line 306. At the times when the amplifier is requested to make more power than this maximum power, the amplifier will typically instead produce its maximum power as indicated by waveform 307. Because the output power is lower than the requested power, the integrated error signal in the control loop can grow large by the time that the ramp down begins. After the ramp down, there can be a delay 410 between the requested power reducing and the actual power reducing as this integrated error signal is removed from the control node. After this delay, the output power can rapidly converge to the requested power as seen in the waveform in region 411. This can cause a failure to pass the upper limit 102 of the time mask, as the power waveform in region 411 can be above the mask. Additionally, a sharp transition such as area 309 and high slope in region 411 can cause failure to comply with the output frequency spectrum.

Another aspect of power control loops is the protection of the amplifier from over-voltage and over-current conditions. If the load presented to the amplifier is different from the intended load, typically 50 Ohms, then the amplifier may be subjected to higher voltage or current stresses. These effects can result in over-voltage conditions that can be greater than the rated voltage, or over-current conditions that can be greater than the rated current. These conditions can reduce the operating lifetime of the amplifier or even cause immediate destruction if not avoided. Prior art power control systems that take measures to avoid these over-voltage and over-current conditions can be used to avoid this reliability issue, but these prior art power control systems add complexity and cost to the amplifier.

In many applications, such as in cellular phones and other portable devices, it is desirable to limit the current drain from the battery so that the device can be used for a longer time before re-charging the battery. As a result, the higher current that can be caused by load mismatch is disadvantageous even if the amplifier reliability is not a concern. Nevertheless, prior art systems are not effective at effectively eliminating power drain resulting from load mismatch.

SUMMARY OF THE INVENTION

Therefore, a system and method for power amplifier power control is provided that use a combined voltage and current detector to avoid power amplifier clipping and wind-up. Furthermore, this power control system and method can assist in avoiding over-voltage and over-current conditions in the power amplifier.

In particular, an architecture for detecting amplifier power is provided. The architecture includes a voltage envelope detector that receives a voltage signal and generates a voltage envelope signal. A current envelope detector receives a current signal and generates a current envelope signal. A power amplifier level controller receives the greater of the voltage envelope signal and the current envelope signal, such as by connecting the output of the voltage envelope detector and the current envelope detector at a common point and conducting the high frequency current components to ground via a capacitor. A power amplifier level control signal is then generated based on the voltage drop across the capacitor.

In accordance with an exemplary embodiment of the present invention, an architecture for detecting amplifier power with a voltage envelope detector and a current envelope detector is provided, such as for use in a cellular telephone or other suitable circuits. The controller receives the greater of the voltage envelope and current envelope and generates an output signal that is used to control the power amplifier level.

The present invention provides many important technical advantages. One important technical advantage of the present invention is an architecture for detecting amplifier power which can avoid degraded performance under output load mismatch. By using the combined voltage and current detector, clipping and wind-up caused by load mismatch can be avoided. Furthermore, since the voltage and current are both being monitored, the power control loop can avoid over-voltage and over-current events caused by load mismatch.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
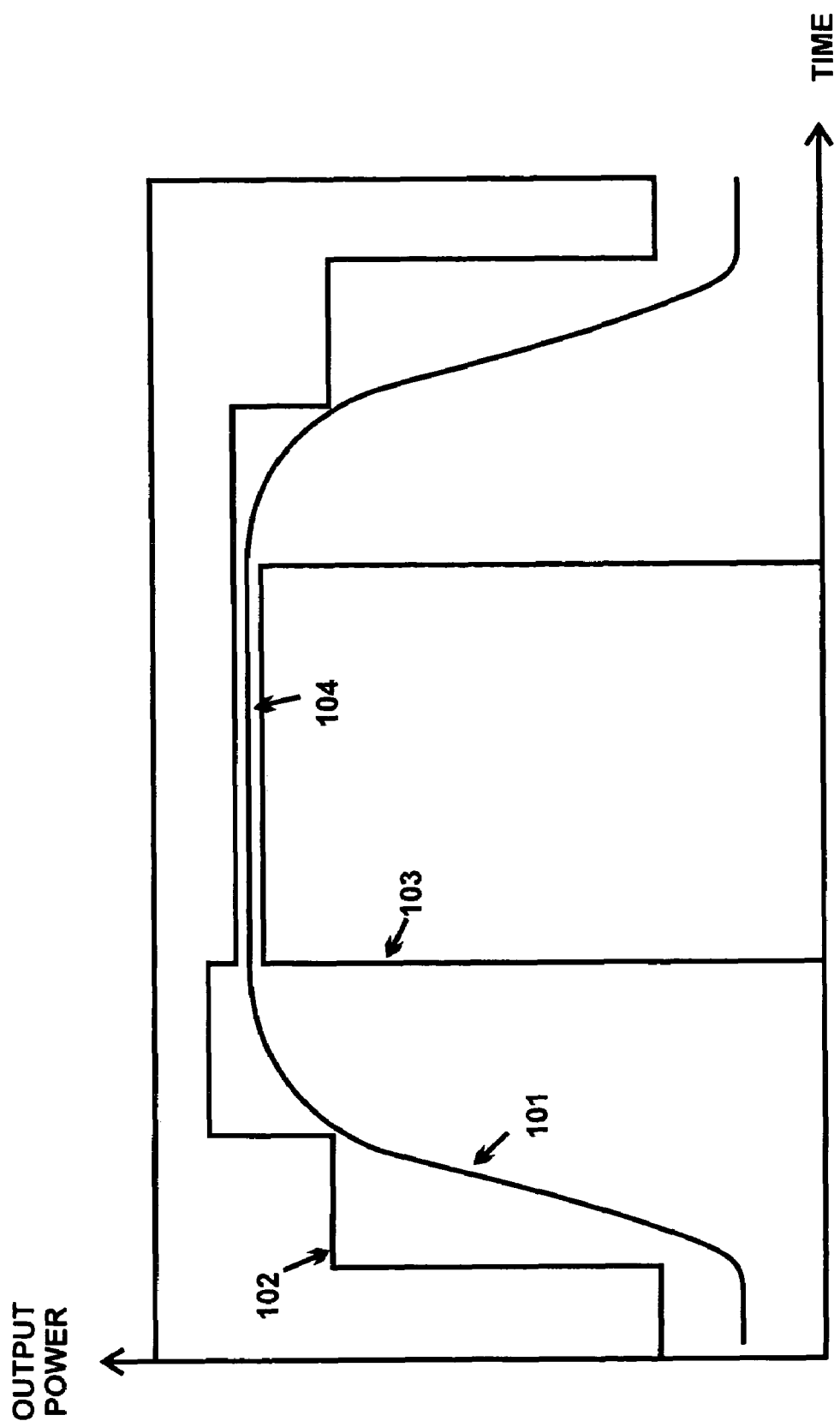
FIG. 1 is a diagram of a representative plot of the output power of a prior art power amplifier in a time-division multiple-access communications system, such as in GSM cellular telephony.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

Figure 5:
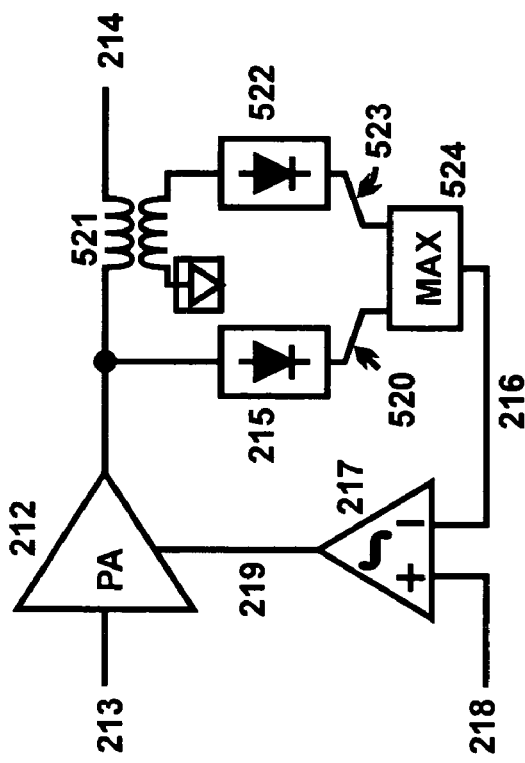
FIG. 5 is a diagram of power amplifier and power control system in accordance with an exemplary embodiment of the present invention.
Figure 2:
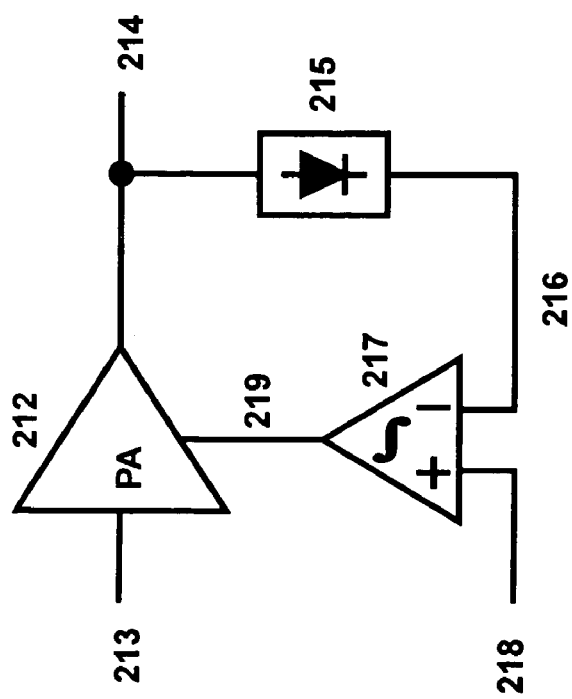
FIG. 2 is a diagram of a prior art power amplifier and power control system using output voltage detection.
Figure 3:
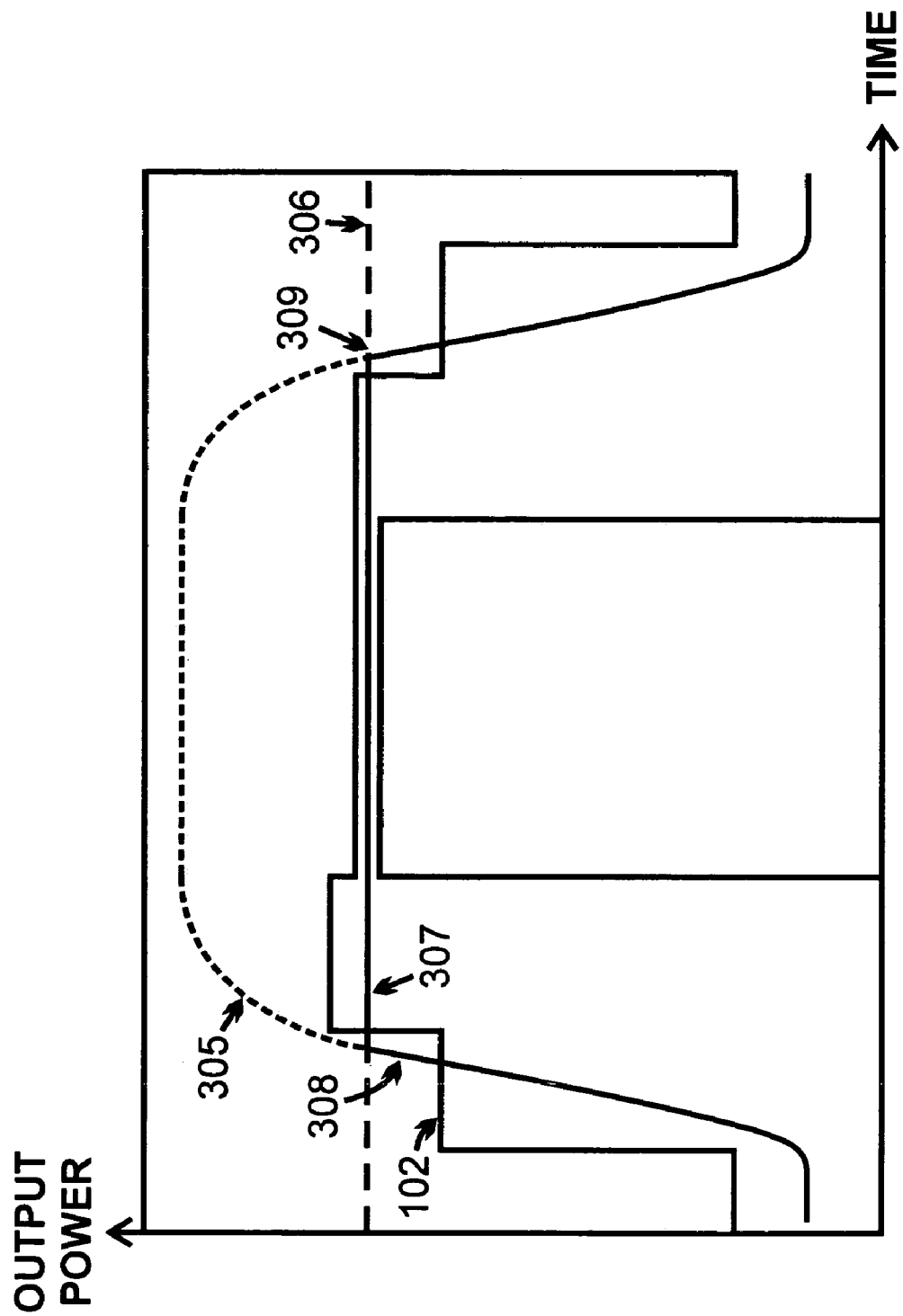
FIG. 3 is a diagram of a representative prior art power versus time plot in a situation where this clipping occurs.
Figure 4:
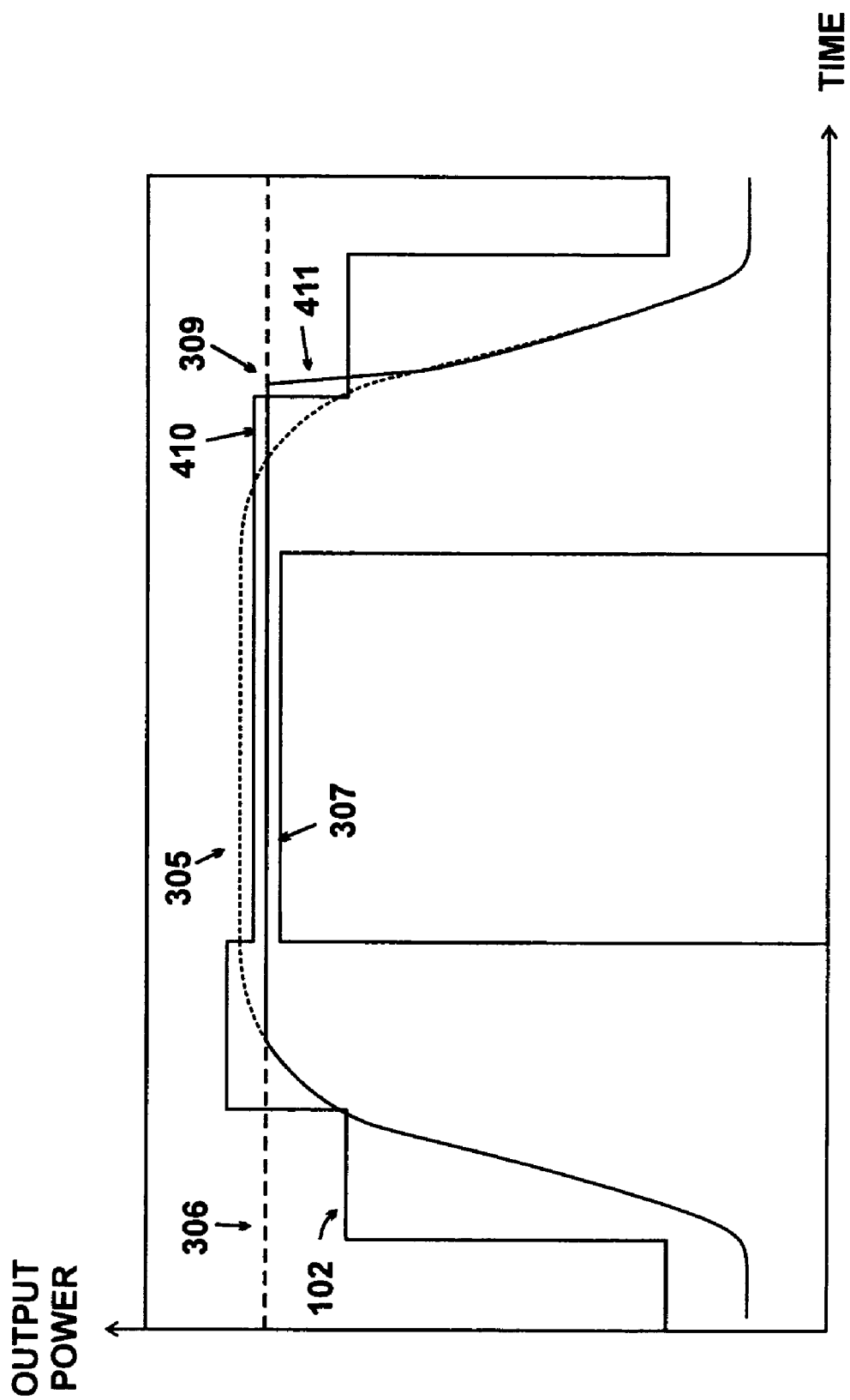
FIG. 4 is a representative prior art power versus time plot in a situation where this wind-up occurs.

FIG. 5 is a diagram of power amplifier 212 and power control system 500 in accordance with an exemplary embodiment of the present invention. Power amplifier 212 and power control system 500 can be implemented in silicon, silicon germanium, gallium arsenide, or other suitable materials. Likewise, power amplifier 212 and power control system 500 can be implemented on a single integrated circuit, from discrete components, from a combination of integrated circuits and discrete components, or in other suitable manners.

Power amplifier 212 and power control system 500 can generate a signal 520 that is proportional to the rf voltage envelope at the output and another signal 523 that is proportional to the rf current envelope at the output. The rf voltage envelop of signal 520 can be generated a number of ways, such as through the use of envelope voltage detector 215. Likewise, there are a number of ways to generate a current envelope signal, such as through the use of sense transformer 521 in combination with detector 522. The feedback signal 216 of power control system 500 is generated from the greater of the voltage and current envelope signals, such as by using maximum detector circuit 524 which outputs the greater of its two inputs. Error amplifier 217, which may be an integrating amplifier, a differencing amplifier, or other suitable amplifier, compares the feedback signal 216 to a power control input signal 218 so as to adjust control signal 219 in a way which tends to reduce the difference between the feedback and input signals. In this way, control signal 219 can control the output power of power amplifier 212.

By adjusting the constants of proportionality between the rf voltage and current envelopes and their respective signals 520 and 523, the levels of signals 520 and 523 can be controlled so as to be similar when power amplifier 212 is presented with the nominal/design load, such as 50 Ohms. In this configuration, power control system 500 avoids clipping and wind-up of power amplifier 212, since the mismatch conditions which cause these events typically cause either the voltage or the current envelope to increase from their values when there is no load mismatch. As a result, feedback signal 216 can increase in these conditions, causing the system to behave as if the output power were greater than it actually is, reducing the actual output power so that clipping and wind-up can be reduced or eliminated.

Power control system 500 can also have the benefit of avoiding high voltage stress in power amplifier 212 under load mismatch. Since the output voltage or current envelope typically increases under the conditions that high voltage stress occurs on power amplifier 212, the resulting increase in feedback signal 216 can result in power amplifier 212 reducing its output power, which can reduce the stress. Similarly, power control system 500 can avoid high current stress in power amplifier 212.

Figure 6:
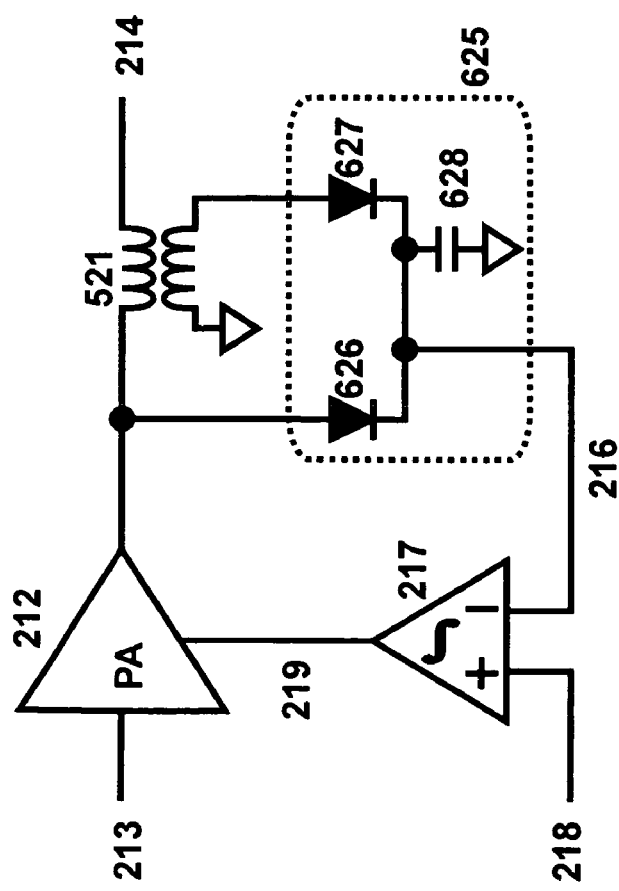
FIG. 6 is a diagram of power control system with increased reliability and efficiency, in accordance with an exemplary embodiment of the present invention.

FIG. 6 is a diagram of power control system 625 with increased reliability and efficiency, in accordance with an exemplary embodiment of the present invention. Power control system 625 includes detecting devices 626 and 627, which can be diodes or other suitable devices, and holding capacitor 628. The value of sense transformer 521 and holding capacitor 628 are selected so that power control system 600 generates an output signal which is proportional to the greater of the envelopes of the two inputs received from detecting devices 626 and 627. In this manner, maximum detector circuit 524 can be eliminated, which reduces the complexity and increases the reliability and efficiency of power control system 600.

Figure 7:
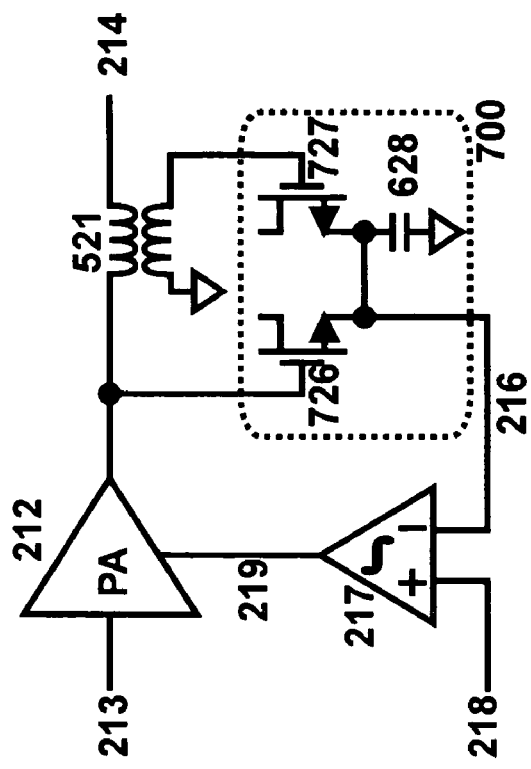
FIG. 7 is a diagram of power control system with transistors, in accordance with an exemplary embodiment of the present invention.

FIG. 7 is a diagram of power control system 700 with transistors, in accordance with an exemplary embodiment of the present invention. Power control system 700 includes transistors 726 and 727 in place of detecting devices 626 and 627. Transistors 726 and 727 are connected so that their gates (if MOSFET), bases (if bipolar), or other suitable control terminals (if other devices) are connected to the rf signal and their sources (if MOSFET), emitters (if bipolar), or other suitable current transmitting terminal (if other devices) are connected to holding capacitor 628, which is coupled to voltage common/ground. The drains (if MOSFET), collector (if bipolar), or other suitable current receiving terminal (if other devices) can be connected to a power supply or other suitable connection. Transistors 726 and 727 allow the rf signal to be connected to a high impedance input, and the current supplied to feedback signal 216 and holding capacitor 628 can be taken from the transistor drain or collector rather than from the rf signal driver, such as power amplifier 212. This can reduce the loading on the rf signal driver.

Figure 8:
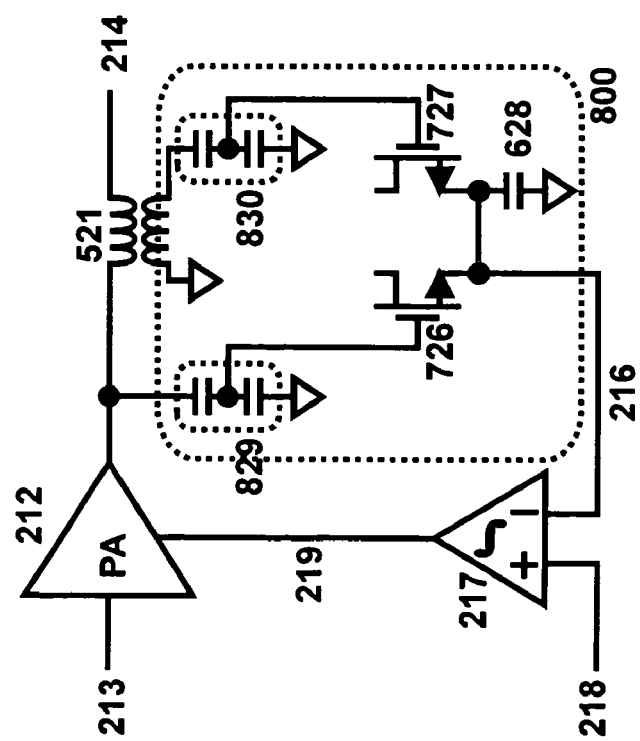
FIG. 8 is a diagram of a power control system with detector rf attenuators, in accordance with an exemplary embodiment of the present invention.

FIG. 8 is a diagram of a power control system 800 with detector rf attenuators, in accordance with an exemplary embodiment of the present invention. Power control system 800 includes rf attenuators 829 and 830 in series with transistors 726 and 727. Rf attenuators 829 and 830 can be implemented using capacitive dividers as depicted, or in other suitable manners, and provide a predetermined signal level to the control inputs of transistors 726 and 727. For instance, the capacitors or other components of rf attenuators 829 and 830 can be selected so that the signal levels at the control inputs of transistors 726 and 727 are approximately equal to each other when there is no mismatch. Furthermore, rf attenuators 829 and 830 can also reduce the rf voltage level presented to transistors 726 and 727 if un-attenuated signals have voltage levels that are too high to be presented to the control terminals of transistors 726 and 727 directly, such as if there is a potential reliability or dynamic range issue if such signals are not attenuated.

Figure 9:
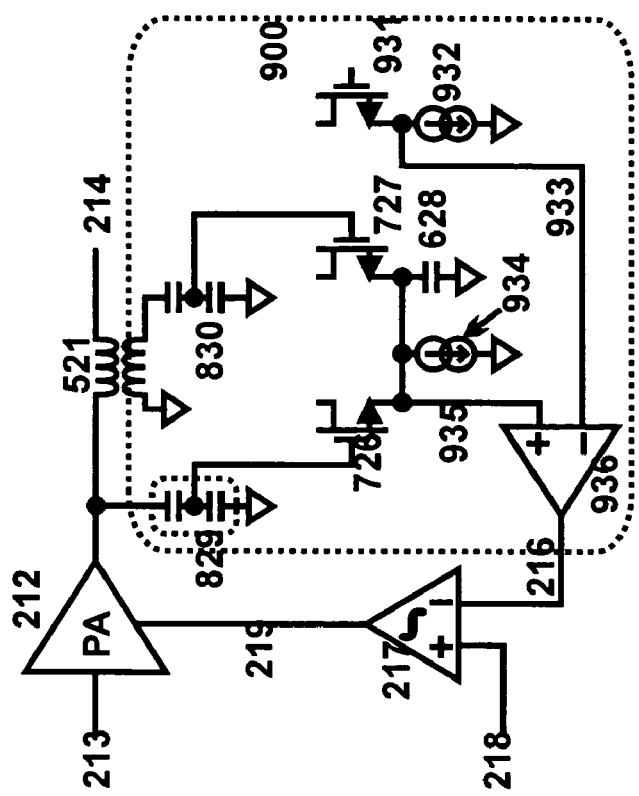
FIG. 9 is a diagram of power control system with offset cancellation, in accordance with an exemplary embodiment of the present invention.

FIG. 9 is a diagram of power control system 900 with offset cancellation, in accordance with an exemplary embodiment of the present invention. Power control system includes an offset cancellation circuit, such as transistor 931 and subtracting amplifier 936. As feedback signal 216 can have a dc offset caused by transistors 726 and 727, a dc value may need to be added to the detected output envelope. However, the dc value may vary as a function of part tolerance variations to part, temperature, or other variables. To reduce this offset variation, transistor 931, which can be more readily matched to transistors 726 and 727, can be used. By placing similar dc biasing conditions on transistors 931, 726 and 727, but no rf input signal on transistor 931, offset signal 933 can be generated that is close to the detected signal 935 that would be generated had the rf envelopes been zero. Subtracting amplifier 936 can subtract this offset signal 933 from the detected signal 935, generating feedback signal 216 with the offset reduced or removed. To ensure that detecting devices are biased properly, current sources 932 and 934 can be used as the pull down elements in the detectors. By appropriately scaling the currents provided by current sources 932 and 934, such as by sizing them proportional to the device areas of the detecting devices each is connected to, the offset may be further reduced.

Figure 10:
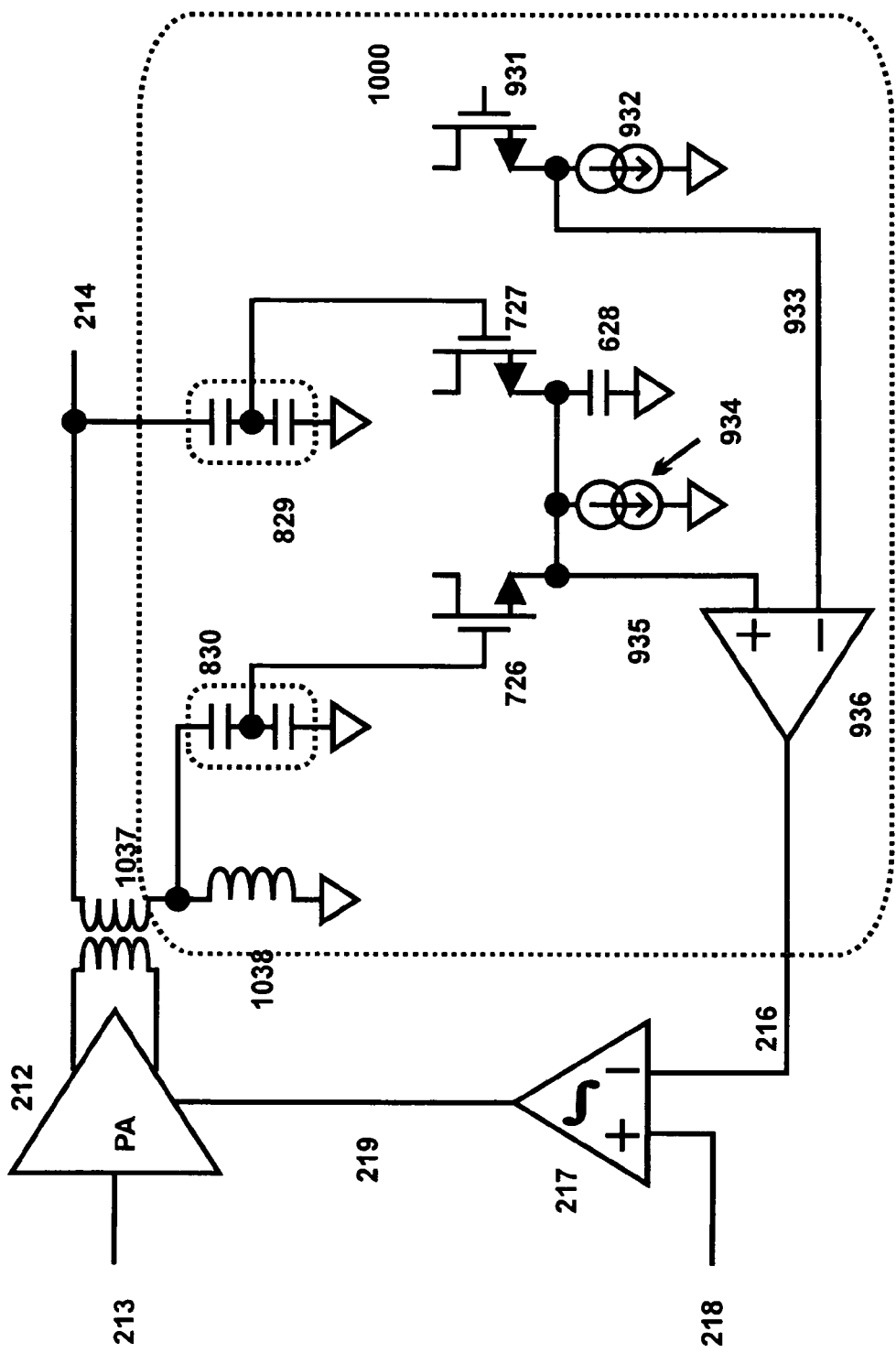
FIG. 10 is a diagram of power control system with an alternative current detector configuration, in accordance with an exemplary embodiment of the present invention.

FIG. 10 is a diagram of power control system 1000 with an alternative current detector configuration, in accordance with an exemplary embodiment of the present invention. Power control system 1000 includes inductor 1038, which is used to detect the current envelope. In many cases, such as when the power amplifier includes an output transformer 1037 to couple signal into the load, there are inductances present in the current path of the output transformer that have currents through them which are substantially the same as the load current, for example, where inductor 1038 is a bond wire that connects the transformer ground to the package ground or voltage common, such that the power amplifier load current effectively flows through the bond wire. In this case, power control system 1000 can sense the power amplifier current envelope by coupling the voltage drop across this bond wire to transistor 726, such as through optional rf attenuator 830. In this way, the current detection path can be made without use of additional components, such as might be used to create sense transformer 521 as shown in FIGS. 5 through 9.

Figure 11:
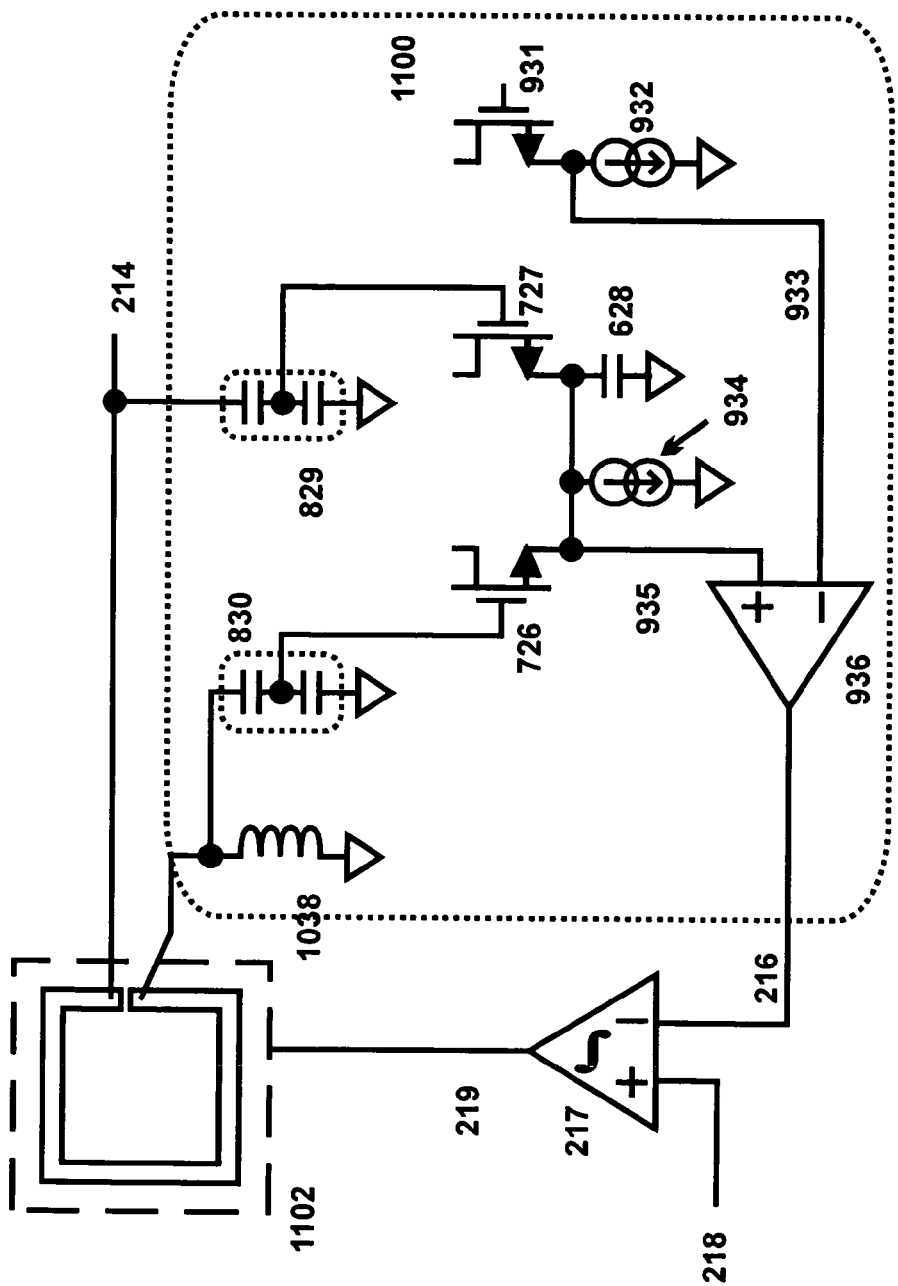
FIG. 11 is a diagram of power control system with a distributed active transformer, in accordance with an exemplary embodiment of the present invention.

FIG. 11 is a diagram of power control system 1100 with a distributed active transformer, in accordance with an exemplary embodiment of the present invention. Power control system 1100 includes distributed active transformer 1102, such as that disclosed in U.S. Pat. Nos. 6,737,948 and 6,856,199, each of which is hereby incorporated by reference for all purposes. Distributed active transformer 1102 includes a ground wire that operates as inductor 1038, which is used to detect the current envelope. Power control system 1100 senses the current envelope by coupling the voltage drop across this bond wire to transistor 726, such as through optional rf attenuator 830.

Figure 12:
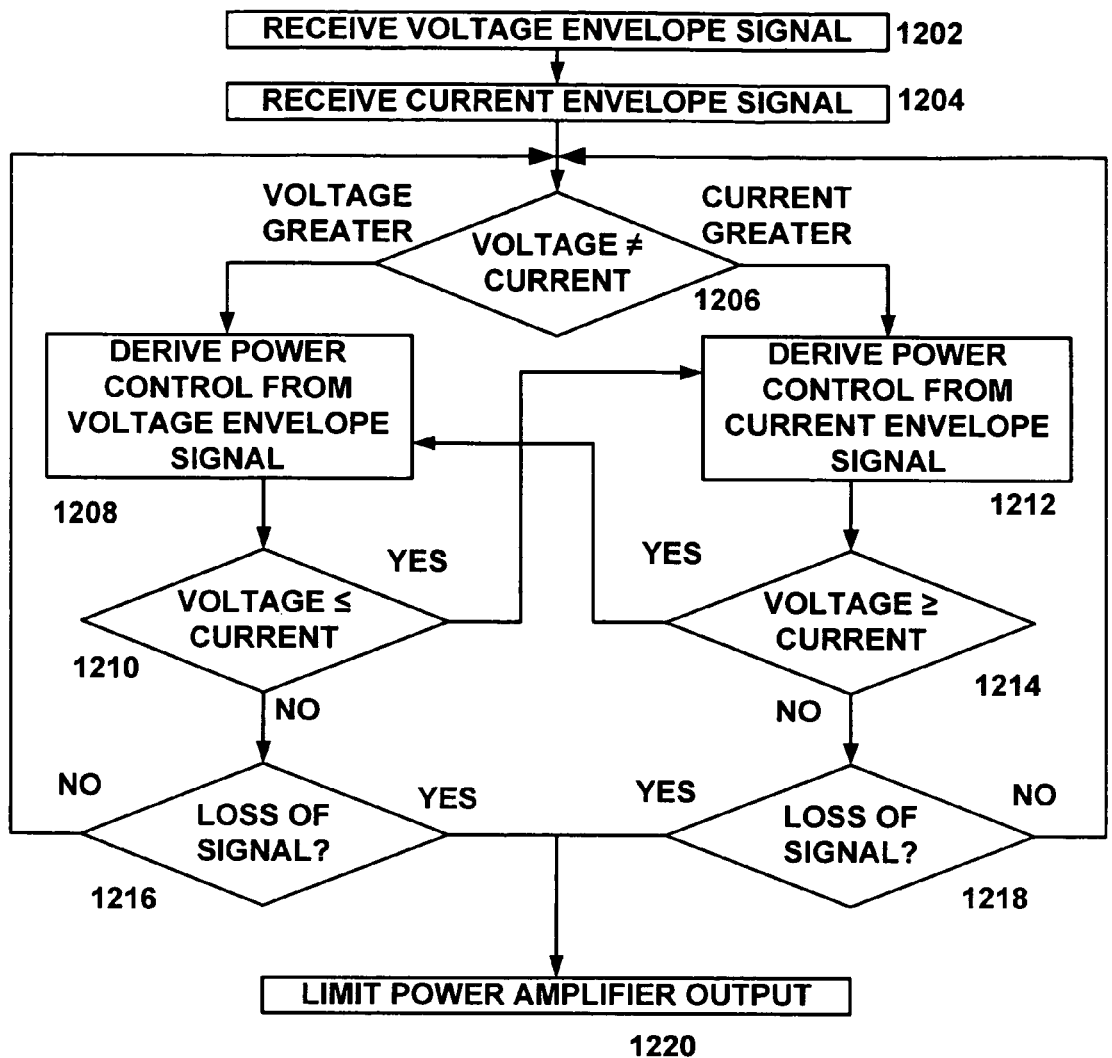
FIG. 12 is a flowchart method for power amplifier level control in accordance with an exemplary embodiment of the present invention.

FIG. 12 is a flowchart method 1200 for power amplifier level control in accordance with an exemplary embodiment of the present invention. Method 1200 allows a power amplifier level controller to receive a single input that transitions from a voltage envelope control state to a current envelope control state without requiring multiple inputs and other circuitry for selecting between the voltage envelope and the current envelope.

Method 1200 begins at 1202 where a voltage envelope signal is received. In one exemplary embodiment, the voltage envelope signal is derived from the load voltage seen at an output, such as through a capacitive voltage dividing network or other suitable attenuator. The method then proceeds to 1204.

At 1204, a current envelope signal is received. In one exemplary embodiment, the current envelope signal can be generated by a capacitive voltage dividing network or other suitable attenuator, such as one that is in parallel with a bond wire for a secondary winding of a circular geometry power amplifier or other suitable current envelope signals. The method then proceeds to 1206.

At 1206, it is determined whether the voltage envelope signal is not equal to the current envelope signal. If the power amplifier is providing power at a level that is within the rating of the power amplifier, then the voltage envelope signal will equal the current envelope signal, and no change in state will occur until the voltage envelope signal is greater than or lesser than the current envelope signal. If the voltage envelope signal is greater than the current envelope signal, the method proceeds to 1208.

The 1208, the power control is derived from the voltage envelope signal. In one exemplary embodiment, an increase in the voltage envelope signal may occur if the load being driven by the power amplifier increases in impedance, such as due to a VSWR event, capacitive coupling, inductive coupling, or some other effect. The method then proceeds to 1208 where it is determined whether the voltage envelope signal has changed and is now less than or equal to the current envelope signal. If the voltage envelope signal has not changed or has become equal to the current envelope signal, then the method proceeds to 1216 where it is determined whether there has been any loss of signal. If no loss of signal has been detected the method returns to 1206, where it is determined whether the voltage envelope signal and current envelope signals match.

Likewise, if it is determined that 1210 that the voltage envelope signal has dropped to a level below that of the current envelope signal, the method proceeds to 1212 where power control is derived from the current envelope signal, such as to limit the power amplifier output if the load impedance has decreased below a predetermined allowable level. The method then proceeds to 1214 where it is determined whether the voltage envelope signal is now greater than or equal to the current envelope signal. If the voltage envelope signal is greater than or equal to the current envelope signal, the method returns to 1206, otherwise the method proceeds to 1218 where it is determined whether a loss of signal has occurred. If no loss of signal has occurred the method returns to 1206.

Likewise, if it is determined at either 1216 or 1218 that a loss of signal has occurred, then the method proceeds to 1220 where the power amplifier output is shut down.

In operation, method 1200 allows the control of a power amplifier to be maintained based on the greater of a voltage envelope signal or a current envelope signal without requiring separate control circuitry for each. In one exemplary embodiment, method 1200 can be used in power amplifiers having bond wire connections where a voltage is generated that is proportional to a current being provided to a load, and also where the load voltage can be measured, such as by using a capacitive voltage divider.

In view of the above detailed description of the present invention and associated drawings, other modifications and variations are apparent to those skilled in the art. It is also apparent that such other modifications and variations may be effected without departing from the spirit and scope of the present invention.

What is claimed is:

1. An architecture for detecting amplifier power comprising:
    a detector receiving a first signal having an envelope related to a power amplifier output voltage envelope and a second signal having an envelope related to a power amplifier output current envelope and generating a control signal based on the greater of the first signal envelope and the second signal envelope, wherein the detector further comprises
        a first transistor receiving the first signal coupled to the first transistor's gate or base;
        a second transistor receiving the second signal coupled to the second transistor's gate or base; and wherein
        the first transistor's source or emitter is coupled to the second transistor's source or emitter; and
    a power amplifier level controller receiving the control signal and generating a power amplifier level control signal.

2. The system of claim 1 wherein the transistor receives the first signal from an attenuator coupled to the power amplifier output.

3. The system of claim 1 wherein the transistor receives a the second signal from an attenuator coupled to a current path of the power amplifier.

4. The system of claim 1 further comprising an offset canceling circuit generating an offset signal that is approximately equal to an offset signal of the detected signal.

5. The system of claim 1 wherein the transistor receives a the second signal from an attenuator coupled in parallel with a bond wire of a distributed active transformer.

6. An architecture for detecting amplifier power comprising:
  a power amplifier generating a load current and a load voltage;
  a detector receiving a first signal having envelope related to a load voltage envelope signal and a second signal having envelope related to a current envelope signal and generating a control signal based on the greater of the first signal and the second signal;
  a power amplifier level controller receiving the control signal and generating a power amplifier level control signal; and
  a capacitor having a first terminal coupled to the detector and a second terminal coupled to voltage common.

7. The power amplifier of claim 6 wherein the power amplifier comprises a distributed active transformer.

8. The power amplifier of claim 6 wherein the detector comprises a first transistor receiving the first signal.

9. The power amplifier of claim 6 wherein the detector comprises a second transistor receiving the second signal.

10. The power amplifier of claim 6 further comprising an offset canceling circuit generating an offset signal that is approximately equal to an offset of the detector.

11. The power amplifier of claim 6 comprising a voltage envelope detector that further comprises:
  an attenuator; and
  a transistor having an input coupled to the attenuator.

12. The power amplifier of claim 6 comprising a current envelope detector that further comprises:
  an inductance in series with a power amplifier load current;
  an attenuator receiving an input signal related to the voltage across the inductance; and
  a transistor having an input coupled to the attenuator.

13. The power amplifier of claim 12 wherein the inductance is a bond wire inductance of a distributed active transformer.

14. A method for detecting amplifier power comprising:
  generating a first signal having envelope related to the voltage envelope of the power amplifier output;
  generating a second signal having envelope related to the current envelope of the power amplifier output;
  generating a control signal based on a greater of the envelope of the first signal and the envelope of the second signal using a detector;
  providing the control signal to the power amplifier;
  wherein the first signal is generated using an attenutator including a first capacitor coupled between the first signal and a common voltage; and
  the second signal is generated using an attenuator including a second capacitor coupled between the second signal and a common voltage.

15. The method of claim 14 wherein the first signal is generated by coupling the power amplifier output to a transistor in the detector.

16. The method of claim 14 wherein the second signal is generated by coupling a bond wire voltage to a transistor in the detector.

17. An architecture for detecting amplifier power comprising:
  a detector receiving a first signal having an envelope related to a power amplifier output voltage envelope and a second signal having an envelope related to a power amplifier output current envelope and generating a control signal based on the greater of the first signal envelope and the second signal envelope;
  a power amplifier level controller receiving the control signal and generating a power amplifier level control signal; and
  an offset canceling circuit generating an offset signal that is approximately equal to an offset signal of the detected signal.

18. The system of claim 17 wherein the detector further comprises a transistor receiving the first signal.

19. The system of claim 17 wherein the detector further comprises a transistor receiving the second signal.

20. The system of 17 wherein the detector further comprises:
  a first transistor receiving the first signal coupled to the first transistor's gate or base;
  a second transistor receiving the second signal coupled to the second transistor's gate or base; wherein
  the first transistor's source or emitter is coupled to the second transistor's source or emitter.

21. The system of claim 18 wherein the transistor receives the first signal from an attenuator coupled to the power amplifier output.

22. The system of claim 19 wherein the transistor receives a the second signal from an attenuator coupled to a current path of the power amplifier.

23. The system of claim 17 wherein the transistor receives a the second signal from an attenuator coupled in parallel with a bond wire of a distributed active transformer.

24. An architecture for detecting amplifier power comprising:
  a power amplifier generating a load current and a load voltage;
  a detector receiving a first signal having envelope related to a load voltage envelope signal and a second signal having envelope related to a current envelope signal and generating a control signal based on the greater of the first signal and the second signal;
  a power amplifier level controller receiving the control signal and generating a power amplifier level control signal; and
  an offset canceling circuit generating an offset signal that is approximately equal to an offset of the detector.

25. The power amplifier of claim 24 wherein the power amplifier comprises a distributed active transformer.

26. The power amplifier of claim 24 further comprising a capacitor having a first terminal coupled to the detector and a second terminal coupled to voltage common.

27. The power amplifier of claim 24 wherein the detector comprises a first transistor receiving the first signal.

28. The power amplifier of claim 24 wherein the detector comprises a second transistor receiving the second signal.

29. The power amplifier of claim 24 comprising a voltage envelope detector that further comprises:
  an attenuator; and
  a transistor having an input coupled to the attenuator.

30. The power amplifier of claim 24 comprising a current envelope detector that further comprises:
  an inductance in series with a power amplifier load current;
  an attenuator receiving an input signal related to the voltage across the inductance; and
  a transistor having an input coupled to the attenuator.

31. The power amplifier of claim 30 wherein the inductance is a bond wire inductance of a distributed active transformer.

* * * * *

UNITED STATES PATENT AND TRADEMARK OFFICE
CERTIFICATE OF CORRECTION

PATENT NO.       : 7,486,137 B2
APPLICATION NO.  : 11/655000
DATED            : February 3, 2009
INVENTOR(S)      : Rahul Magoon et al.

It is certified that error appears in the above-identified patent and that said Letters Patent is hereby corrected as shown below:

Col. 8, line 59, please delete "a";

Col. 8, line 65, please delete "a";

Col. 10, line 11, please add "claim" after "of";

Col. 10, line 23, please delete "a";

Col. 10, line 26, please delete "a."

Signed and Sealed this

Twenty-first Day of April, 2009

JOHN DOLL
*Acting Director of the United States Patent and Trademark Office*